United States Patent [19]

Ludikhuize

[11] Patent Number: 4,952,998
[45] Date of Patent: Aug. 28, 1990

[54] INTEGRATED CIRCUIT WITH COMPLEMENTARY MOS TRANSISTORS

[75] Inventor: Adrianus W. Ludikhuize, Eindhoven, Netherlands

[73] Assignee: U.S. Philips Corp., New York, N.Y.

[21] Appl. No.: 334,963

[22] Filed: Apr. 7, 1989

[30] Foreign Application Priority Data

Apr. 11, 1988 [NL] Netherlands .................... 8800922

[51] Int. Cl.⁵ .............................................. H01L 27/02
[52] U.S. Cl. .................................... 357/42; 357/23.11; 357/48; 357/52; 357/89
[58] Field of Search ................ 357/42, 48, 23.11, 52, 357/89

[56] References Cited

U.S. PATENT DOCUMENTS 4,574,467  3/1986  Halfacre et al. ...................... 357/42

FOREIGN PATENT DOCUMENTS 0199654  9/1986  Japan ...................................... 357/42

Primary Examiner—Edward J. Wojciechowicz
Attorney, Agent, or Firm—Steven R. Biren

[57] ABSTRACT

An integrated CMOS circuit having a transistor located in a p (or an n) well and a adjacent complementary transistor. The transistors are located in an epitaxial layer on a highly doped substrate. With use, for example, in bridge circuits having an inductive load, parasitic currents can occur, which give rise to "latch-up" and-/or dissipation. This can be avoided by providing under the source zone of the transistor located beside the wells a second region having substantially the same doping and depth as the well, which is connected to the source zone.

4 Claims, 2 Drawing Sheets

INTEGRATED CIRCUIT WITH COMPLEMENTARY MOS TRANSISTORS

BACKGROUND OF THE INVENTION

The invention relates to a semiconductor device having at least one pair of complementary insulated gate field effect transistors and having a semiconductor body with a highly doped substrate of a first conductivity type, a less highly doped epitaxial layer of the first conductivity type disposed on it and adjoining a surface of the body and a first region of the second opposite conductivity type, which also adjoins the surface and is entirely surrounded within the semiconductor body by the epitaxial layer, source and drain zones of the first conductivity type of a first insulated gate field effect transistor being provided within the first region and source and drain zones of the second conductivity type of a second insulated gate field effect transistor being provided beside the first region, of which the source zone is located between the drain zone and the first region, while a second region of the second conductivity type is provided below the source zone of the second field effect transistor.

A semiconductor device of the kind described above is known from the published European Patent Application No. EP 138162.

Integrated monolithic circuits comprising complementary insulated gate field effect transistors, generally designated as CMOS circuits, are used frequently and for many applications.

In given circumstances, more particularly in the presence of an inductive load, one or more pn junctions inherent in the semiconductor structure and connected under normal operating conditions in the reverse direction can become connected in the forward direction and can convey current. This gives rise to dissipation and in certain cases, especially in circuits having a high packing density, to "latch-up", i.e. to the ignition of parasitic pnpn ("thyristor") structures, which afterwards cannot be switched off or can be switched off only with difficulty, which may even lead to irrepairable damage of the device.

Attempts can be made to avoid these effects by disposing the various semiconductor zones farther away from each other and by thus increasing the resistance of the various current paths and reducing the possibility of parasitic thyristor effect. However, the advantage of a high packing density is thus lost.

The European Patent Application No. EP 138162 discloses a semiconductor device comprising complementary field effect transistors, in which, in order to counteract the aforementioned "latch-up" effect, a highly doped layer-shaped buried lattice is provided under the whole CMOS structure, which lattice is in contact with and has the same conductivity type as the "first" region.

SUMMARY OF THE INVENTION

The invention has inter alia for its object to provide a solution for the problem described, in which no additional masking and doping steps are required and an efficient dissipation of the charge carriers causing the "latch-up" effect is ensured.

According to the invention, a semiconductor device of the kind described above is characterized in that the second region has substantially the same doping and depth as the first region and is electrically connected to the source zone of the second field effect transistor.

The charge carriers injected by the drain zone of the second transistor into the epitaxial layer and in the direction of the first region if this drain zone becomes temporarily connected in the forward direction, for example under the influence of an inductive load, are collected by the second region without dissipation, while the second region further screens injection to any other "first" regions present in the circuit. The risk of "latch-up" is thus also avoided or at any rate is strongly reduced.

The measure according to the invention can be generally realized without additional masking and doping steps simultaneously with the first region.

The electrical connection between the second region and the source zone of the second transistor can be established in different ways. According to an important preferred embodiment of the invention, the source zone of the second field effect transistor adjoins the second region and is provided with openings, within which the epitaxial layer extends as far as the surface, while a conductive layer at the surface adjoins both the source zone (connected to the second region) and the epitaxial layer.

Under certain circumstances, it may be advantageous that a highly doped buried layer of the second conductivity type is present under the second region between the epitaxial layer and the substrate, which buried layer then contacts the second region. As a result, an even more effective collection of the parasitic charge carriers is attained, but at the expense of an additional masking and doping step.

The invention is of major importance in bridge circuits, for example for driving small electric motors, which constitute an inductive load of the bridge circuit and consequently often give rise to voltage peaks, which initiate the "latch-up" phenomenon described. Therefore, an important preferred embodiment of the semiconductor device according to the invention is characterized in that the first and second field effect transistors form part of a bridge circuit, which is connected between two supply lines and further comprises third and fourth field effect transistors of the same structure as the first and second field effect transistors, respectively, while under the source zone of the fourth transistor also a second region connected to this source zone is provided, the source zones of the first and third transistors being connected to one supply line and the source zones of the second and fourth transistors being connected to the other supply line, the interconnected drain electrodes of the first and fourth transistors constituting one output terminal and the interconnected drain zones of the second and third transistors constituting the other output terminal of the bridge circuit.

BRIEF DESCRIPTION OF THE DRAWING

The invention will now be described more fully with reference to an embodiment and the drawing, in which.

Figure 1:
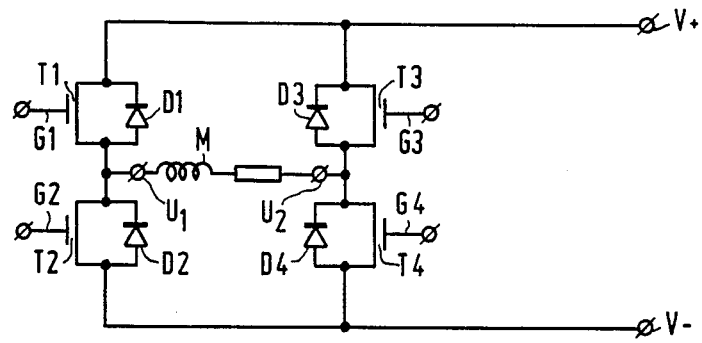
FIG. 1 shows the circuit for driving an inductive load.

The Figures are schematic and not drawn to scale, and in particular the dimensions in the direction of thickness are exaggerated. Corresponding parts are generally designated by the same reference numerals and semiconductor regions of the same conductivity type are generally cross-hatched in the same direction.

DESCRIPTION OF THE PREFERRED EMBODIMENTS

FIG. 1 shows the circuit diagram of a CMOS bridge circuit comprising two p-channel MOS transistors $T_1$ and $T_3$ and two n-channel MOS transistors $T_2$ and $T_4$. Such a bridge circuit is used, for example, for driving small electric motors, indicated here diagrammatically as "inductive" load M. The source zones of the p-channel transistors $T_1$ and $T_3$ are connected to one positive supply line $V+$ and the source zones of the n-channel transistors $T_2$ and $T_4$ are connected to the other negative supply line $V-$. By control voltages at the gate electrodes $G_1$ to $G_4$, two of the transistors are simultaneously rendered conducting. For example, first the transistors $T_1$ and $T_4$ and then the transistors $T_2$ and $T_3$ can be rendered conducting.

During change-over, when the transistors $T_2$ and $T_3$ pass from the conductive state to the non-conductive state and the transistors $T_1$ and $T_4$ pass from the non-conductive state to the conductive state, it may happen that, depending upon the output capacitance, due to a voltage peak caused by the inductive load M, the output $U_1$ is temporarily applied to a higher potential than the supply line $V+$ and the output $U_2$ is applied to a lower potential than the supply line $V-$.

In a conventional integration, as that which is shown diagrammatically in cross-section in FIG. 2, dissipation and "latch-up" can then occur due to the fact that the diodes $D_1$ and $D_4$ becomes conducting, which will be explained more fully hereinafter.

Figure 2:
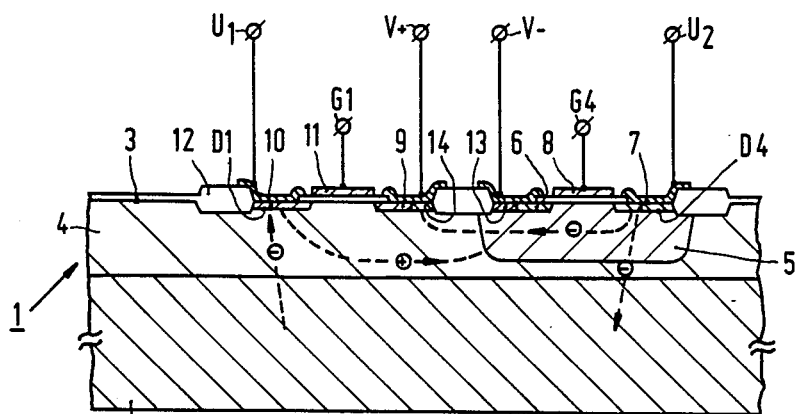
FIG 2 shows diagrammatically in cross-section two complementary field effect transistors $T_1$ and $T_4$ of the circuit shown in FIG. 1 in a known integrated CMOS bridge circuit.

The cross-section of FIG. 2 shows two complementary insulated gate field effect transistors $T_1$ and $T_4$ of such a conventional bridge circuit. These transistors are provided in a semiconductor body 1 having a highly doped substrate 2 of a first conductivity type, in this case, for example, an n-type silicon substrate. On the substrate 2 is disposed a more weakly-doped epitaxial layer 4 of the same n-conductivity type adjoining a surface 3 of the body. Further, a first region 5 of the second opposite (so in this case p) conductivity type is present, which also adjoins the surface 3 and is entirely surrounded within the semiconductor body by the epitaxial layer 4.

Within the first region 5, source and drain zones (6, 7) of the (n) conductivity type of a first field effect transistor or MOS transistor $T_4$ having an insulated gate 8 are provided. Beside the first region 5, source and drain zones (9, 10) of the second (p) conductivity type of a second MOS field effect transistor $T_1$ having an insulated gate 11 are provided, of which the source zone 9 is located between the drain zone 10 and the first region 5. The transistors $T_1$ and $T_2$ are each bounded by a sunken oxide pattern 12. The region 5 adjoins the source zone of $T_4$ via a highly doped p-type contact zone 13 and the layer 4 is connected via a highly doped n-type contact zone 14 to the source electrode of $T_1$.

If now (cf. FIG. 1) first the transistors $T_2$ and $T_3$ are conducting and then change-over takes place, $T_2$ and $T_3$ passing to the non-conducting state and $T_1$ and $T_4$ in turn becoming conducting, depending upon the output capacitance, due to the inductive load M the output $U_1$ can be applied for a short time to a voltage higher than the positive supply voltage $V+$ and the output $U_2$ can be applied for a short time to a voltage lower than the negative supply voltage $V-$. The diode $D_1$ constituted by the drain zone 10 and the layer 4 and the diode $D_4$ constituted by the region 5 and the drain zone 7 then become conducting and injection currents are produced, inter alia a hole current from the zone 10 to the region 5 connected to the negative supply line $V-$ and an electron current from the zone 7 via the region 5 to the connection of the positive supply line $V+$ on the layer 4 at the source zone 9 (cf. FIG. 2). Due to these parasitic currents, dissipation takes place, while moreover the pnpn structure constituted by the drain zone 10, the layer 4, the region 5 and the drain zone 7 can be ignited thereby. Afterwards it is extremely difficult, if not impossible, to eliminate this "latch-up" condition again.

In the aformentioned European Patent Application 138162, as a measure to avoid "latch-up" it is suggested to provide a highly doped buried lattice in the layer 4 having the same conductivity type as the region 5 and adjoining the region 5.

A more satisfactory collection of the parasitic charge carriers is attained by the measure according to the present invention, which moreover generally does not require an additional masking and doping step.

Figure 3:
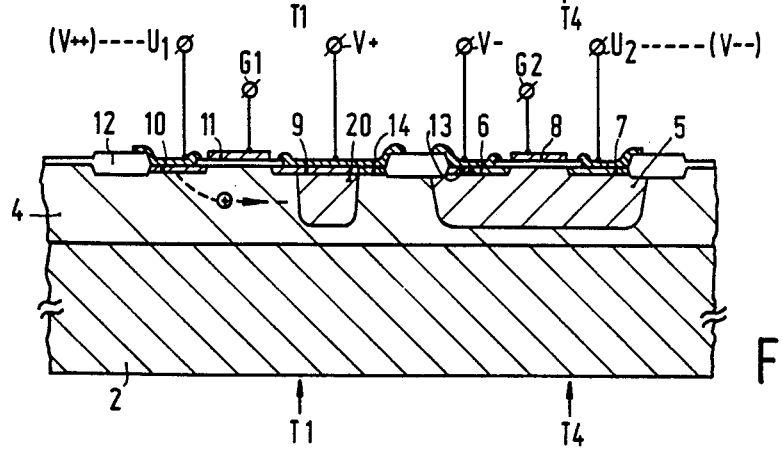
FIG. 3 shows diagrammatically in cross-section the structure of the complementary field effect transistors $T_1$ and $T_4$ in a semiconductor device according to the invention.

This measure consists in that (cf. FIG. 3) a second p-type region 20 is provided below the source zone 9, which second region has substantially the same doping and depth as the first region 5 and is electrically connected to the source zone 9 of the second field effect transistor $T_1$.

Figure 4:
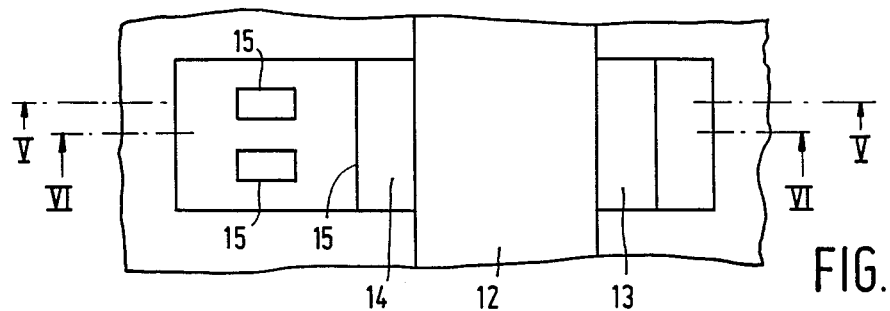
FIG. 4 shows diagrammatically in plan view a detail of the complementary field effect transistors shown in FIG. 3.
Figure 5:
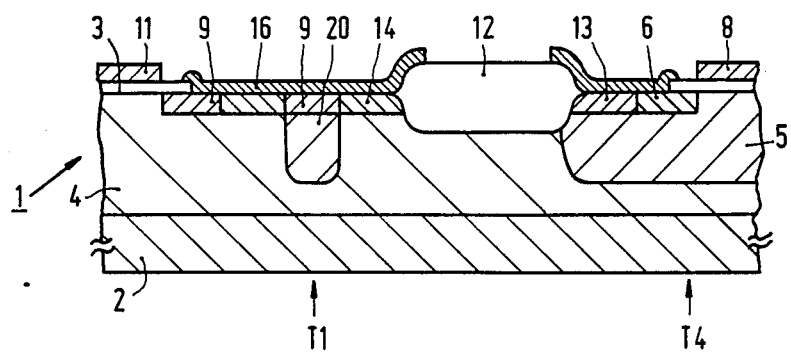
FIG. 5 shows diagrammatically a cross-section of FIG. 4 taken on the line V—V.
Figure 6:
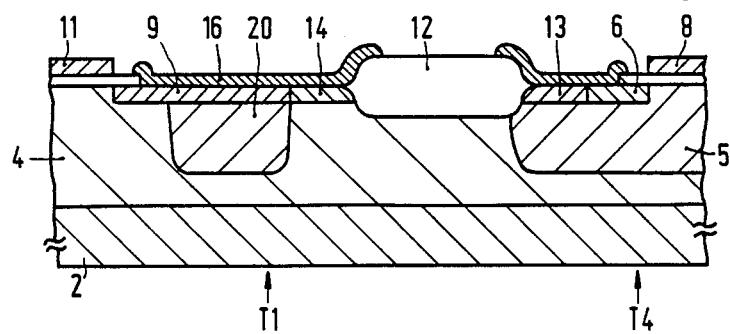
FIG. 6 shows diagrammatically a cross-section of FIG. 4 taken on the line VI—VI.

This electrical connection is established in the present embodiment in that the source zone 9 of the second transistor $T_1$ adjoins the second region 20, while the source zone 9 is further provided with openings 15, within which a source electrode 16 contacting the source zone 9 is electrically connected to the epitaxial layer 4. This is shown in the cross-section of FIG. 3, in detail in FIG. 4 (plan view), in FIG. 5 (cross-section of FIG. 4 taken on line V—V) and in FIG. 6 (cross-section of FIG. 4 taken on the line VI—VI). Another possibility is that the substrate contact of $T_1$ is realized via the highly doped substrate 2; in this case, the openings 15 and the zone 14 can be omitted.

By the region 20, the aforementioned holes, which are injected with a temporary voltage peak (positive ($V++$) at $U_1$ and negative ($V--$) at $U_2$) by the drain zone 10 towards the region 5, are collected substantially without dissipation in the lateral npn transistor (10, 4, 9/20). Moreover, the region 20 screens hole injection to other adjacent p-type regions 5.

As a result, the dissipation is considerably reduced and especially the risk of thyristor effect or "latch-up" strongly decreases.

The invention can be used of course not only in CMOS bridge circuits, although it is of particular importance in this case. The invention may be used advantageously in general sense in all monolithic integrated circuits in which complementary field effect transistors are employed.

Figure 7:
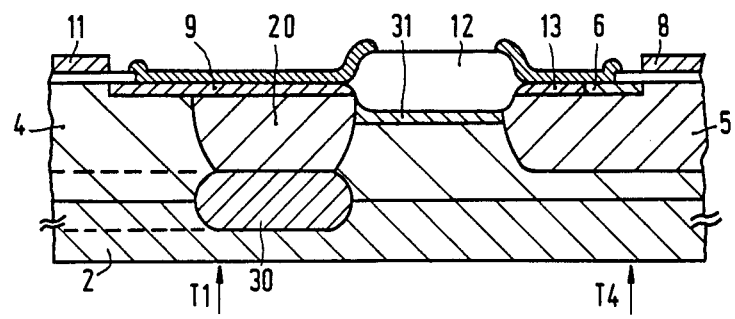
FIG. 7 shows diagrammatically a cross-section of a variation of the semiconductor device according to the invention.

The invention may also be used in structures in which all conductivity types are inverted with respect to those given in the above examples. In this case, the signs of all voltages should also be inverted, while the holes are replaced by electrons (and conversely). In principle, semiconductor materials other than silicon may also be used. If desired, (cf. FIG. 7) a further highly doped buried layer 30 of the second (so here p) conductivity type may be provided under the second region 20 between the epitaxial layer 4 and the substrate 2, which buried layer contacts the region 20. As a result, a substantially complete collection of the parasitic hole current is attained. However, this requires an additional masking and doping step. The layer 4 may be contacted via the substrate 2. The buried layer 30 may extend under the whole transistor $T_1$ as far as the edge of the silicon wafer (see dotted lines in FIG. 7). In this case, the layer 4 must be contacted at $T_1$, like in FIG. 5, on the upper side. A highly doped n-type channel stopper 31 under the oxide 12 is then generally required.

I claim:

1. A semiconductor device comprising at least one pair of complementary insulated gate field effect transistors and having a semiconductor body with a highly doped substrate of a first conductivity type, a less highly doped epitaxial layer of the first conductivity type disclosed on it and adjoining a surface of the body, and a first region of a second, opposite conductivity type, which also adjoins the surface and is entirely surrounded within the semiconductor body by the epitaxial layer, source and drain zones of the first conductivity type of a first insulated gate field effect transistor of said pair being provided within the first region, and source and drain zones of the second conductivity type of a second insulated gate field effect transistor of said pair being provided beside the first region, the source zone of the second transistor being located between its drain zone and the first region, and a second region of the second conductivity type provided below only the source zone of the second field effect transistor, characterized in that the second region has substantially the same doping and depth as the first region and is in contact with and electrically connected to the source zone of the second field effect transistor.

2. A semiconductor device as claimed in claim 1, further comprising a highly doped contact zone of the first conductivity type, characterized in that the source zone of the second field effect transistor adjoins the second region and is provided with openings within which a source electrode contacting the source zone is electrically connected to the epitaxial layer by said contact zone.

3. A semiconductor device is claimed in claim 1 or 2, characterized in that a highly doped buried layer of the second conductivity type is present under the second region between the epitaxial layer and the substrate, which buried layer contacts the second region and is more highly doped than the second region.

4. A semiconductor device as claimed in claims 1 or 2, characterized in that the first and second field effect transistors form part of a bridge circuit, which is connected between two supply lines and further comprises third and fourth field effect transistors having the same structure as the first and second field effect transistors, respectively, while under the source zone of the fourth transistor is also located a region connected to this source zone, the source zones of the first and third transistors being connected to one supply line and the source zones of the second and fourth transistors being connected to the other supply line, the interconnected drain electrodes of the first and fourth transistors constituting one output terminal and the interconnected drain electrodes of the second and third transistors constituting the other output terminal of the bride circuit.

* * * * *